(12) United States Patent
Igarashi et al.

(10) Patent No.: US 12,288,760 B2
(45) Date of Patent: Apr. 29, 2025

(54) SEMICONDUCTOR DEVICE

(71) Applicant: RENESAS ELECTRONICS CORPORATION, Tokyo (JP)

(72) Inventors: Takayuki Igarashi, Tokyo (JP); Hirokazu Sayama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 519 days.

(21) Appl. No.: 17/835,541

(22) Filed: Jun. 8, 2022

(65) Prior Publication Data

US 2023/0010383 A1 Jan. 12, 2023

(30) Foreign Application Priority Data

Jul. 12, 2021 (JP) .................................. 2021-115299

(51) Int. Cl.
*H01L 23/00* (2006.01)
(52) U.S. Cl.
CPC .............. *H01L 24/05* (2013.01); *H01L 24/45* (2013.01); *H01L 2224/02235* (2013.01); *H01L 2224/02255* (2013.01); *H01L 2224/0226* (2013.01); *H01L 2224/04042* (2013.01);
(Continued)

(58) Field of Classification Search
CPC ...................... H01L 24/05; H01L 24/45; H01L 2224/02235; H01L 2224/02255; H01L 2224/0226; H01L 2224/04042; H01L 2224/4502; H01L 2224/45147; H01L 2924/35121; H01L 21/7624; H01L 21/764; H01L 24/48; H01L 2224/05624; H01L 2224/48247; H01L 2224/48463; H01L 2224/48824; H01L 2924/10253; H01L 29/0649; H01L 27/0207; H01L 21/76224; H01L 23/485
See application file for complete search history.

(56) References Cited

U.S. PATENT DOCUMENTS

| | | | | |
|---|---|---|---|---|
| 7,642,653 | B2 * | 1/2010 | Kuzuhara | H01L 23/5283 438/622 |
| 10,546,802 | B2 * | 1/2020 | Sekikawa | H01L 23/5226 |
| 10,777,507 | B2 * | 9/2020 | Deguchi | H01L 23/522 |

(Continued)

FOREIGN PATENT DOCUMENTS

JP 2008-135692 A 6/2008

OTHER PUBLICATIONS

Communication pursuant to Article 94(3) EPC dated Sep. 25, 2024, from corresponding European Application No. 22184003.6, 14 pages.

(Continued)

*Primary Examiner* — Khaja Ahmad
*Assistant Examiner* — Khatib A Rahman
(74) *Attorney, Agent, or Firm* — Rimon P.C.

(57) ABSTRACT

A semiconductor device including an element isolation in a trench formed in an upper surface of a semiconductor substrate, a trench isolation including a void in a trench directly under the element isolation, and a Cu wire with Cu ball connected to a pad on the semiconductor substrate, is formed. The semiconductor device has a circular trench isolation arrangement prohibition region that overlaps the end portion of the Cu ball in plan view, and the trench isolation is separated from the trench isolation arrangement prohibition region in plan view.

10 Claims, 15 Drawing Sheets

(52) U.S. Cl.
CPC ............... *H01L 2224/4502* (2013.01); *H01L 2224/45147* (2013.01); *H01L 2924/35121* (2013.01)

(56) References Cited

U.S. PATENT DOCUMENTS

| | | | |
|---|---|---|---|
| 11,227,915 B2* | 1/2022 | Tezuka | H01L 24/05 |
| 11,387,172 B2* | 7/2022 | Deguchi | H01L 24/05 |
| 11,735,498 B2* | 8/2023 | Park | H01L 21/76898 257/508 |
| 2009/0124073 A1* | 5/2009 | Liu | H01L 24/05 257/E21.59 |
| 2012/0248618 A1* | 10/2012 | Akino | H01L 24/03 257/E23.024 |
| 2015/0332956 A1* | 11/2015 | Bieselt | H01L 21/764 438/422 |
| 2021/0249353 A1* | 8/2021 | Sayama | H01L 21/76224 |
| 2022/0020667 A1* | 1/2022 | Park | H01L 21/76898 |

OTHER PUBLICATIONS

Extended European Search Report issued in corresponding European Patent Application No. 22184003.6-1212, dated May 8, 2023.

* cited by examiner

SEMICONDUCTOR DEVICE

CROSS-REFERENCE TO RELATED APPLICATIONS

The disclosure of Japanese Patent Application No. 2021-115299 filed on Jul. 12, 2021, including the specification, drawings and abstract is incorporated herein by reference in its entirety.

BACKGROUND

The present invention relates to semiconductor device, for example, it relates to a technique that is valid by applying to the semiconductor device provided with a trench having a void therein.

There is a semiconductor device having an element isolation structure in which a dielectric film is formed in a trench formed on a surface as a main surface of a semiconductor substrate. Further, there is a semiconductor device having an element isolation (DTI: Deep Trench Isolation) structure (trench isolation) in which a dielectric film having a void is formed in a trench having a high aspect ratio higher than 1 as the aspect ratio that is the ratio of the depth of the trench to the width of the trench. When connecting the semiconductor chip and the lead frame or the like, it is known to connect the Cu wire (bonding wire) with a Cu ball at the tip to the pad on the surface of the semiconductor chip.

There are disclosed techniques listed below.
 [Patent Document 1] Japanese Unexamined Patent Application Publication No. 2008-135692

Patent Document 1 discloses the problem that the Cu electrode is swung by vibration at the time of bonding and cracking occurs in the interlayer dielectric film under the Cu electrode. Here, it is described that the uppermost wiring and electrode layer disposed in the lower layer of the pad portion is formed of a material having a Young's modulus larger than that of the pad portion, thereby preventing the electrode from swinging during bonding.

SUMMARY

In the semiconductor chip having a trench isolation having a void therein, when performing a push-pull test for connection strength evaluation of the Cu wire, shear stress acts on the boundary of the void of the trench isolation directly under the outer peripheral portion of the Cu ball, there is a problem Si peeling or cracking is likely to occur.

Other objects and novel features will become apparent from the description of this specification and the accompanying drawings.

The typical ones of the embodiments disclosed in the present application will be briefly described as follows.

A semiconductor device according to one embodiment has a first trench isolation in a first trench formed in an upper surface of a semiconductor substrate, a second trench isolation having a void directly under the first trench isolation, and a bonding wire having a ball and connected to a pad on the semiconductor substrate. The semiconductor device has a circular trench isolation arrangement prohibition region that overlaps with the end portion of the ball in plan view and the second trench isolation is separated from the trench isolation arrangement prohibition region in plan view.

According to one embodiment, the reliability of the semiconductor device can be improved.

DETAILED DESCRIPTION

Figure 1:
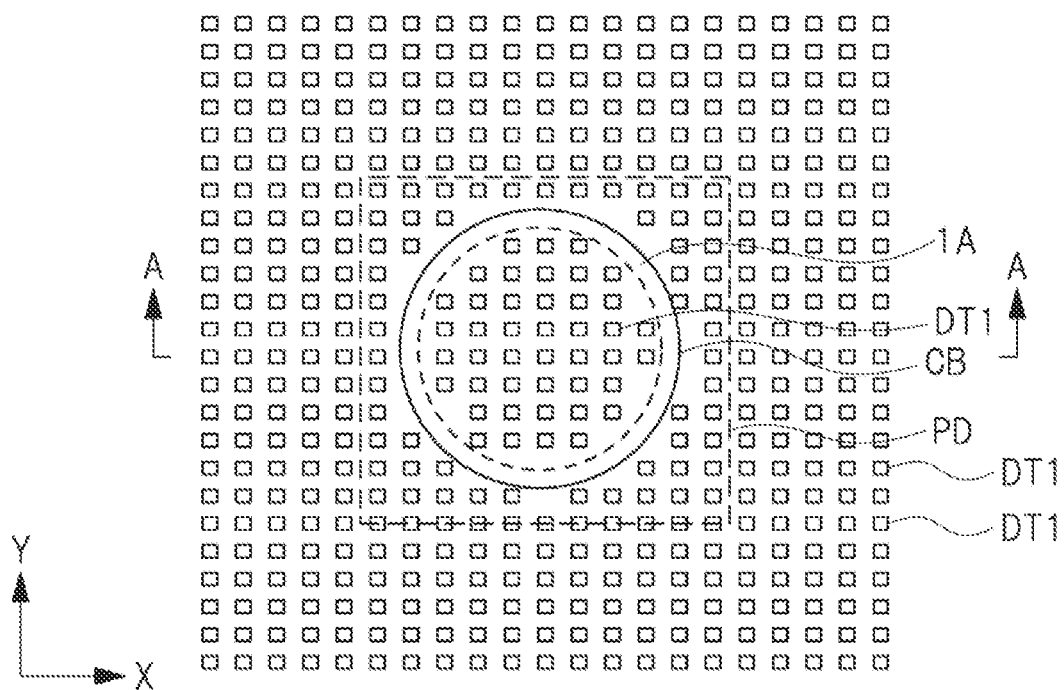
FIG. 1 is a planar layout showing a semiconductor device according to first embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In addition, in the following embodiments, the number of elements or the like (including the number, the number, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the constituent elements (including element steps and the like) are not necessarily essential except for the case in which they are specifically specified, the case in which they are considered to be obviously essential in principle, and the like. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail with reference to the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

Details of Room for Improvement

Figure 13:
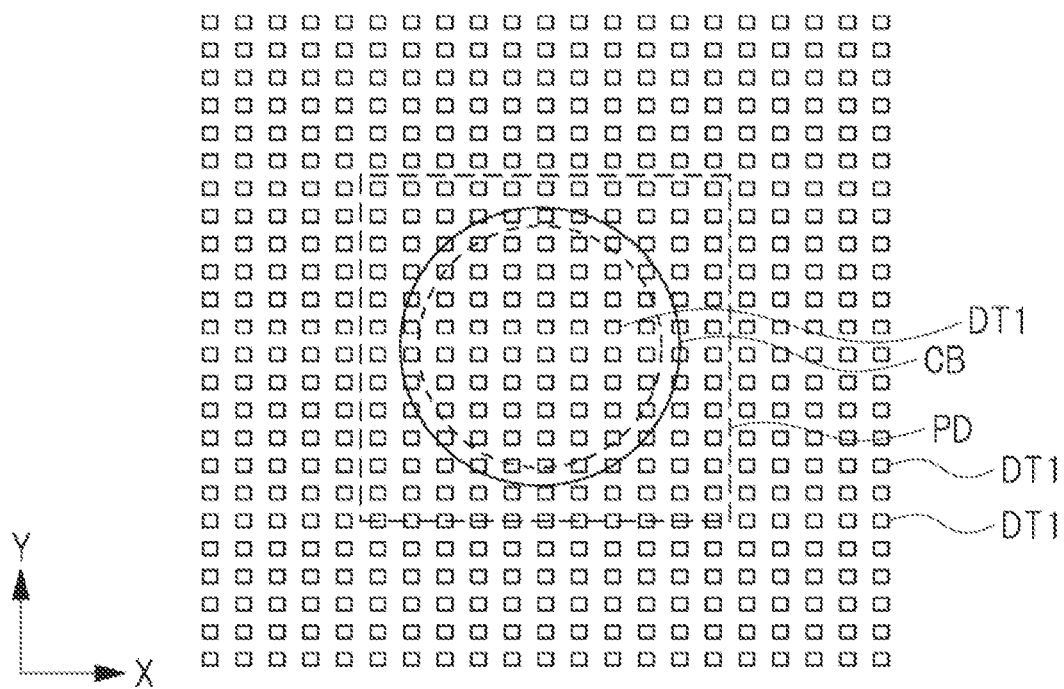
FIG. 13 is a planar layout showing a semiconductor device according to comparative example.

FIG. 13 shows a planar layout of a semiconductor chip which is a semiconductor device according to comparative example. FIG. 13 shows a rectangular pad (electrode pad) PD indicated by a broken line. The circle shown in the central of the pad PD is the contour of the outermost periphery of the Cu ball CB at the tip of the Cu wire which is a bonding wire connected to an upper surface of the pad PD. The dotted circle shown on the inside of the circle is a contour of the bottom surface of the Cu ball CB. Each of the plurality of squares arranged on the matrix in FIG. 13 is a trench isolation DT1 having a rectangular circular layout in plan view. The trench isolation DT1 is an element isolation (element isolation region) including a dielectric film embedded in a trench formed in an upper surface of a semiconductor substrate and a void existed in the dielectric film. That is, each of sides of the square is a trench, the region inside the square in plan view is a region outside the trench.

In the comparative example, the trench isolation DT1 is disposed without any restrictions on the arrangement, including directly under the pad PD. Therefore, the trench isolation DT1 is disposed directly under the region between the end portion of the bottom surface of the Cu ball CB shown by a broken line circle in FIG. 15 and the outermost periphery of the Cu ball CB shown by a solid circle.

Figure 14:
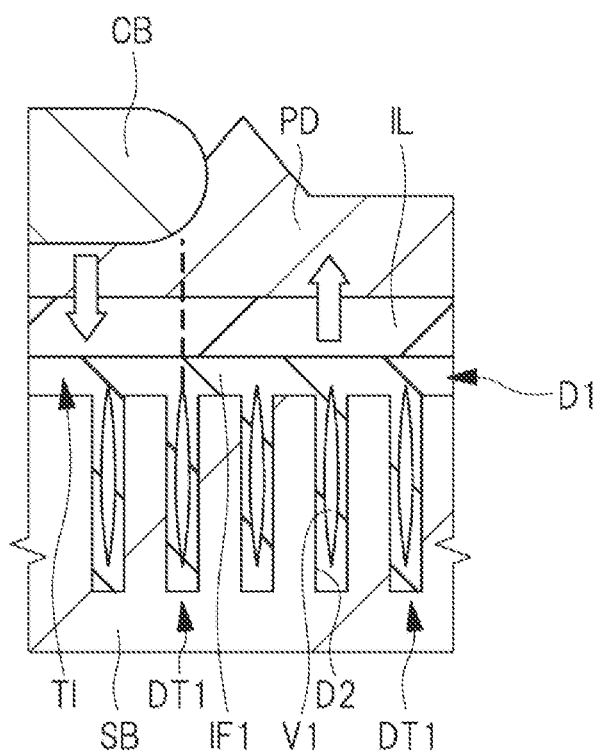
FIG. 14 is a cross-sectional view showing a semiconductor device according to the comparative example.
Figure 15:
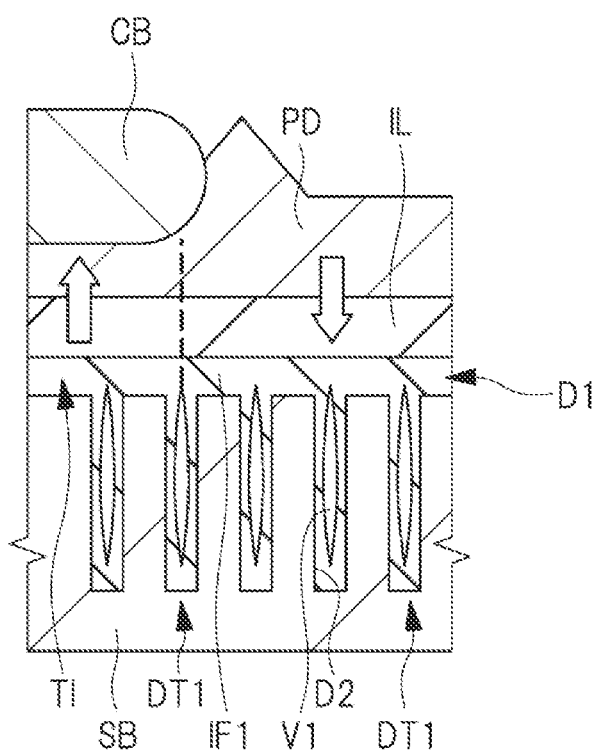
FIG. 15 is a cross-sectional view showing a semiconductor device according to the comparative example.

FIGS. 14 and 15 show enlarged cross-sectional views including the region near the end portion of the Cu ball CB and directly under the Cu ball CB. As shown in FIGS. 14 and 15, the semiconductor chip that is a semiconductor device according to the comparative example has a semiconductor substrate SB, and a trench isolation TI formed of a dielectric film IF1 embedded in the first trench D1 in an upper surface of the semiconductor substrate SB. Further, the semiconductor chip has a plurality of trench isolation DT1 formed directly under the trench isolation TI. The trench isolation DT1 is formed directly under the trench isolation TI and formed of a second trench D2 deeper than the trench D1, a dielectric film IF1 embedded in the trench D2, and a void V1 formed in the dielectric film IF1 in the trench D2.

Here, in the semiconductor device in which the Cu wire is connected to the pad PD on the upper surface of the semiconductor chip, after connecting the Cu wire, a push-pull test for evaluating the connection strength of the Cu wire. In the push-pull test, a test for pressing the Cu wire to the semiconductor chip side, and a test for pulling the Cu wire in a direction away from the semiconductor chip.

At this time, when pressing the Cu wire to the semiconductor chip side, with reference to the trench isolation DT1 directly under the end portion of the Cu ball CB, in the Cu ball CB side, the force is applied in the direction of pressing the semiconductor substrate SB, in the outside of the Cu ball CB, the force acts in the direction of pushing up the semiconductor substrate SB. Conversely, when pulling the Cu wire upward, with reference to the trench isolation DT1 directly under the end portion of the Cu ball CB, the force is applied to pull up the semiconductor substrate SB in the Cu ball CB side, and in the outside of the Cu ball CB, force is applied in the direction to push down the semiconductor substrate SB. Therefore, the shear stress acts on the boundary of the void V1 of the trench isolation DT1 through the push-pull test, silicon peeling (peeling of the silicon substrate), the oxide film peeling, or cracking in the oxide film is likely to occur. The cracking or the like occurs at a place indicated by a thick broken line in FIGS. 14 and 15 with the void V1 at the lower end of the broken line as a starting point.

Thus, in the semiconductor device having a trench isolation with a void V1 and in which wire bonding is performed, there is room for improving the reliability of the semiconductor device by preventing the silicon peeling or cracking when a force is applied to the Cu wire.

Structure of Semiconductor Device

The structure of the semiconductor device according to the present embodiment is described below with reference to FIGS. 1 to 3. The semiconductor device is a semiconductor chip, and the semiconductor chip is provided with a semiconductor element such as a MISFET (Metal Insulator Semiconductor Field Effect Transistor), a diode, a resistive element or a capacitive element. These semiconductor elements are formed in an upper surface vicinity of the semiconductor substrate or in the semiconductor substrate configuring the semiconductor chip.

FIG. 1 shows a rectangular pad (electrode pad) PD shown by a broken line. The circle shown in the central of the pad PD is a contour of the outermost periphery of the Cu ball CB configuring the tip of the Cu wire, which is a bonding wire, connected to the upper surface of the pad PD. The dotted circle shown on the inside of the circle is a contour of the bottom surface of the Cu ball CB. Each of the plurality of squares arranged in a matrix in the X and Y directions in FIG. 1 is a trench isolation DT1 having a rectangular circular layout in plan view. The X and Y directions shown in FIG. 1 are the directions along the upper surface (main surface) of the semiconductor substrate. The X and Y directions are perpendicular to each other in plan view. In the present application, the direction along each of the X direction and Y direction is referred to as the lateral direction, the direction perpendicular to each of the X direction and Y direction is referred to as the vertical direction. The trench isolation DT1 is an element isolation (element isolation region) including a dielectric film embedded in a trench formed in the upper surface of the semiconductor substrate and a void existed in the dielectric film. That is, each of the sides of the square is a trench, the region inside the square in plan view is a region outside the trench. The diameter of the Cu ball CB in plan view is larger than the diameter of the bonding wire.

Figure 2:
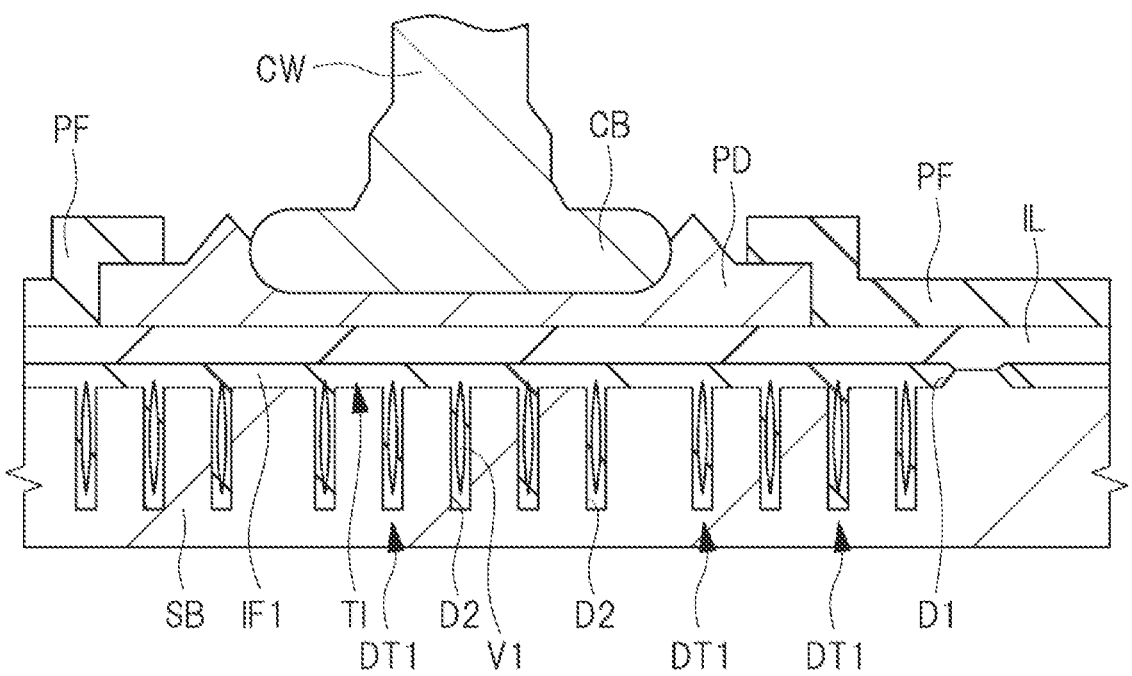
FIG. 2 is a cross-sectional view in line A-A of FIG. 1.

FIG. 2 shows a cross-sectional view in line A-A of FIG. 1. As shown in FIG. 2, the semiconductor device according to the present embodiment has a semiconductor substrate and a trench isolation TI formed of a dielectric film IF1 fully embedded in the first trench D1 in the upper surface of the semiconductor substrate SB. The semiconductor substrate SB is made of, for example, single crystal Si (silicon). Further, the semiconductor chip has a plurality of trench isolations DT1 formed directly under the trench isolation TI. The trench isolation DT1 is formed directly under the trench isolation TI and formed of a second trench D2 deeper than the trench D1, a dielectric film IF1 embedded in the trench D2, and a void (air gap) V1 formed in the dielectric film IF1 in the trench D2. The trench D2 is formed in the bottom surface of the trench D1 and extends downward (the back side of the semiconductor substrate SB).

The trench isolation TI is an element isolation region made of a dielectric film IF1 and formed by, for example, STI (Shallow Trench Isolation) method or LOCOS (LOCal Oxidization of Silicon) method in the main surface of the semiconductor substrate SB. The trench isolation DT1 has a DTI (Deep Trench Isolation) structure. Here, the trench isolations DT1 are referred to as trench isolations as isolating the element by the trenches, the trench isolations DT1 are dummy element isolations which are not actually used for isolating the element. The dummy element isolation is a pseudo element isolation that is provided to suppress manufacturing variations of the trenches D2 formed in the semiconductor chip, including the trenches D2 in which the element isolation contributing to the isolation of the element is formed. That is, the trench isolations DT1 which are dummy element isolations are provided to make the etching depth of the trenches D2 deeper than the trench D1 uniform. By adjusting the occupancy of the trench isolation pattern by placing the dummy element isolations, it is possible to make the etching depth uniform. The trench isolation TI in the vicinity of the upper ends of the trench isolations DT1 which are dummy element isolations is also a dummy element isolation.

An interlayer dielectric film IL is formed on the trench isolation TI, trench isolations DT1 and the semiconductor substrate SB. The interlayer dielectric film IL is mainly formed of a silicon oxide film or the like. However, in practice, the interlayer dielectric film IL is a laminated wiring layer, and has a structure in which a plurality of wiring layers including wirings made of metal is laminated. Although not shown in FIG. 2, the semiconductor elements are formed in the vicinity of the upper surface of the semiconductor substrate SB under the interlayer dielectric film IL. A pad PD mainly made of Al (aluminum) is formed, for example, on the interlayer dielectric film IL. The pad PD is electrically connected to the semiconductor elements via the wirings. The upper surface and side surface of the end portion of the pad PD are covered with a passivation film PF covering the upper surface of the interlayer dielectric film IL.

Cu wire CW which is a bonding wire made of Cu (copper) is connected to the upper surface of the pad PD exposed from the passivation film PF. Specifically, Cu ball CB of the tip of the Cu wire CW is pressed against the upper surface of the pad PD, Cu ball CB is in a state of being collapsed. As a result, a part of the upper surface of the pad PD is raised in the region adjacent to the Cu ball CB. The collapsed Cu ball CB is provided with a flat bottom surface and a side surface formed of curved surface.

The main features of the semiconductor device according to the present embodiment will be described with reference to FIGS. 1 and 3. FIG. 3 is an enlarged cross-sectional view of a part of FIG. 2 (where indicated by a broken line). As shown in FIG. 3, the semiconductor device according to the present embodiment has a trench isolation arrangement prohibition region 1A. The trench isolation arrangement prohibition region 1A is the region between the circle of the broken line and the circle of the solid line shown in FIG. 1. That is, the trench isolation arrangement prohibition region 1A is a circular region overlapping the end portion of the Cu ball CB in plan view.

Figure 3:
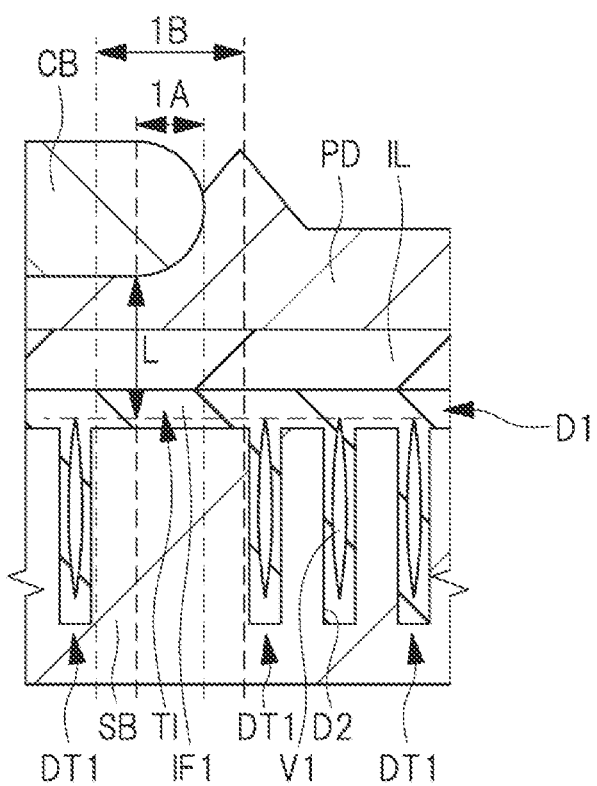
FIG. 3 is an enlarged cross-sectional view of a portion of FIG. 2.

Specifically, the trench isolation arrangement prohibition region 1A is a region between, of the bottom surface of the Cu ball CB shown in FIG. 3, the end portion of the bottom surface of the Cu ball CB closest from the void V1 configuring the trench isolation DT1 in the vertical direction and the outermost periphery of the Cu ball CB in the lateral direction and includes a region directly under the Cu ball CB. In other words, the trench isolation arrangement prohibition region 1A is a shortest region between, of the bottom surface of the Cu ball CB, the end portion of the bottom surface of the Cu ball CB closest from the void V1 configuring the trench isolation DT1 in the vertical direction and the outermost periphery of the Cu ball CB in the radial direction of the Cu ball CB in plan view. The main feature of the semiconductor device according to the present embodiment is that the trench isolations DT1 are not disposed in the semiconductor substrate SB in the trench isolation arrangement prohibition region 1A, but are disposed in the semiconductor substrate SB in other than the trench isolation arrangement prohibition region 1A.

The end portion of the bottom surface of the Cu ball CB closest from the void V1 configuring the trench isolation DT1 in the vertical direction is referred to the end portion of the region in which the distance L is the shortest in the vertical direction (height direction, thickness direction), of the bottom surface of the Cu ball CB shown in FIG. 3. The end portion is a boundary between the region (flat bottom surface) of the bottom surface of the Cu ball CB in which the distance L from the void V1 is the shortest in the vertical direction and the region (side surface having a curved surface) in which the distance from the void V1 to the Cu ball CB in the vertical direction gradually increases toward the outermost periphery of the Cu ball CB.

Effect of Present Embodiment

As described with reference to FIGS. 14 and 15, when the Cu wire is pushed toward the semiconductor substrate SB or pulled upward, if the trench isolations DT1 are formed directly under the end portion of the Cu ball CB, that is, in the trench isolation arrangement prohibition region 1A described above, shear stress acts in the semiconductor substrate SB with reference to the trench isolations DT1. Therefore, in the present embodiment, as shown in FIG. 3, the trench isolations DT1 are not disposed in the trench isolation arrangement prohibition region 1A, thereby preventing the occurrence of the shear stress. Therefore, since silicon peeling, the oxide film peeling, or the occurrence of cracking in the oxide film in the semiconductor chip can be prevented, it is possible to improve the reliability of the semiconductor device. Therefore, the above-mentioned room for improvement can be solved.

Further, in order to prevent silicon peeling, the oxide film peeling, or the occurrence of cracking more reliably in the oxide film, it is necessary to consider misalignment of the Cu ball CB and diameter variation of the Cu ball CB. Therefore, it is more preferable to provide a trench isolation arrangement prohibition region 1B which further expanded the trench isolation arrangement prohibition region 1A in the lateral direction (radial direction of the Cu ball CB in plan view).

Although it is explained that the dielectric film IF1 with the void V1 is buried in the trench D2, the material of the film embedded in the trench D2 may be made of a polysilicon film or a metal film made of W (tungsten) or the like. As a case that a conductive film such as a polysilicon film or a metal film is embedded in the trench D2, a case that a potential is supplied to the semiconductor substrate SB via the conductive film, a case that the conductive film is used for element isolation, or a case that the conductive film is used as a capacitive element, etc. are considered. Whether the polysilicon films or the metal films are embedded in the trenches D2, a void V1 is formed in the polysilicon films or the metal films in the trenches D2. By not forming the trench isolations including such films in the trench isolation arrangement prohibition region 1A, the above-described effects according to the present embodiment can be obtained.

Second Embodiment

Figure 4:
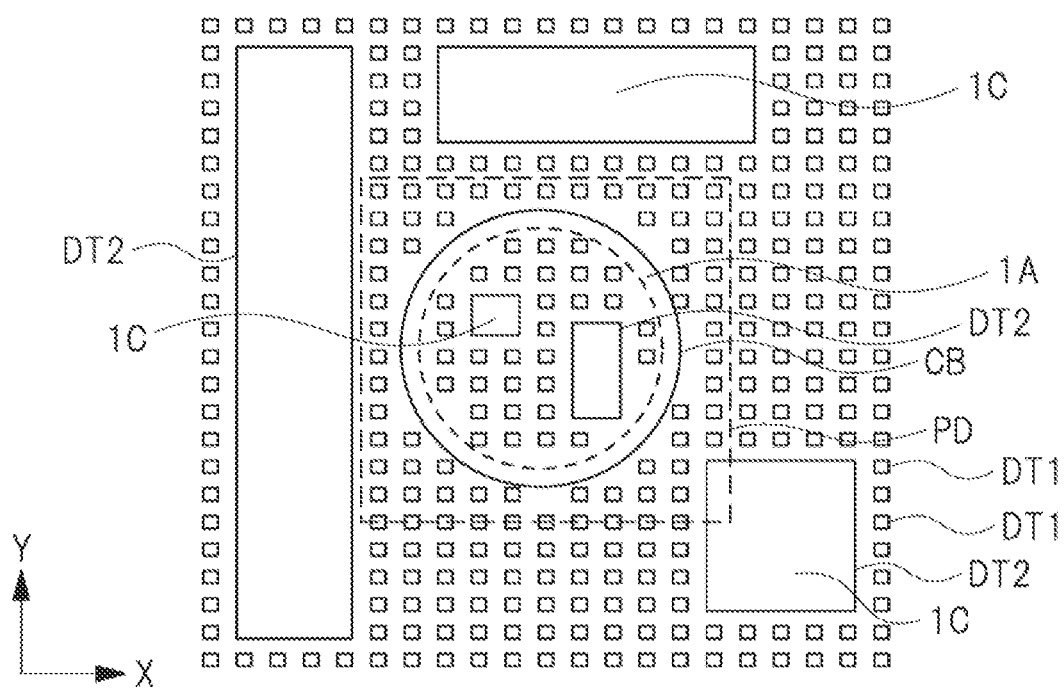
FIG. 4 is a planar layout showing a semiconductor device according to second embodiment.
Figure 5:
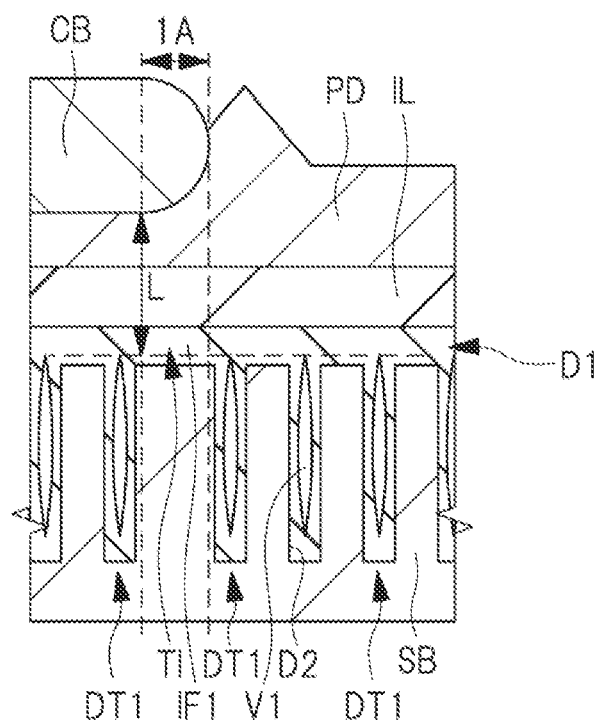
FIG. 5 is an enlarged cross-sectional view showing a semiconductor device according to the second embodiment.

As shown in FIGS. 4 and 5 (in particular, FIG. 4), trench isolations DT2 for electrically isolating the semiconductor elements may be provided. FIG. 5 is, similarly to FIG. 3, an enlarged cross-sectional view showing the vicinity of the end portion of the Cu ball CB. As shown in FIG. 4, in the present embodiment, there is an element region 1C in which the semiconductor elements are formed. Trench isolations DT2 having the same structures as the trench isolations DT1 are formed in the semiconductor substrate around the element region 1C. The trench isolation DT2 has a rectangular circular structure so as to surround the element region 1C in plan view.

Here, the element region 1C and the trench isolation DT2 therearound are formed on the inner and outer sides of the trench isolation arrangement prohibition region 1A, respectively, in plan view. However, in plan view, the trench isolation arrangement prohibition region 1A and the trench isolations DT2 are separated from each other and do not overlap with each other.

In the present embodiment, both the trench isolations DT1 which are dummy element isolations and the trench isolations DT2 which are used for the electrical isolation of the element, are formed at positions separated from the trench isolation arrangement prohibition region 1A. This prevents shear stress from acting in the semiconductor substrate SB with reference to the trench isolations DT1 or DT2 when the Cu wire is pushed toward the semiconductor substrate SB side or pulled upward. Therefore, since silicon peeling, the oxide film peeling or the occurrence of cracking in the oxide film in the semiconductor chip can be prevented, it is possible to improve the reliability of the semiconductor device.

First Modified Example

Figure 6:
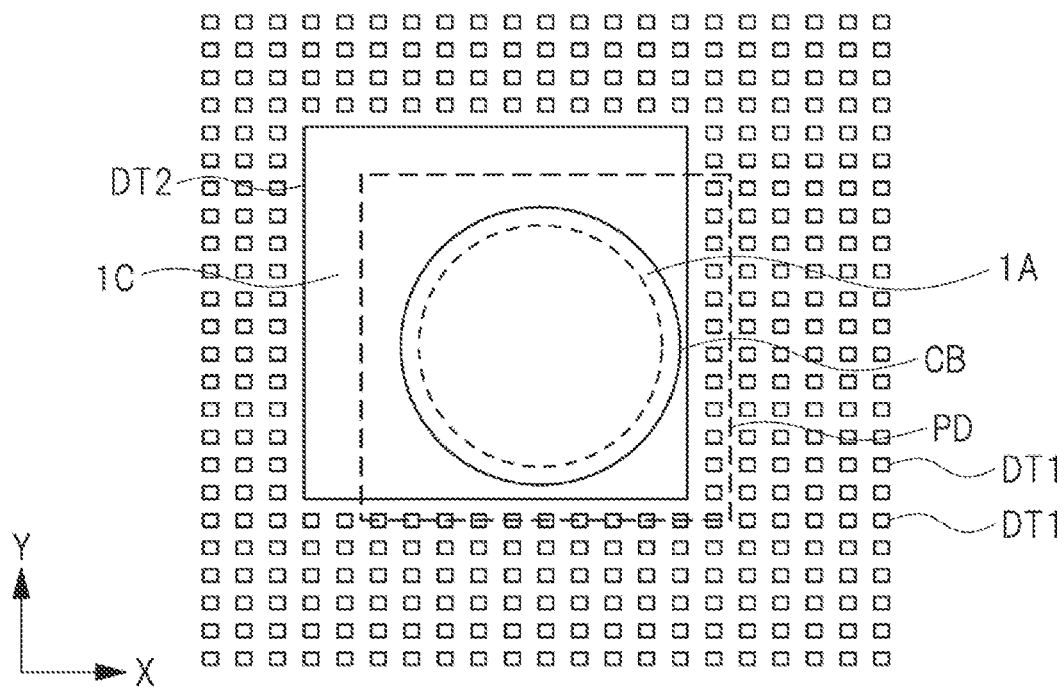
FIG. 6 is a planar layout showing a semiconductor device according to first modified example of the second embodiment.
Figure 7:
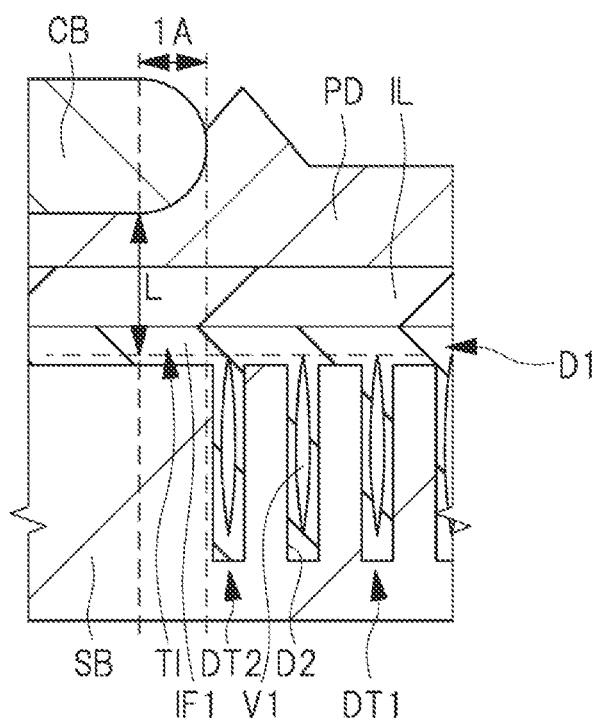
FIG. 7 is an enlarged cross-sectional view showing a semiconductor device according to the first modified example of the second embodiment.

As shown in FIGS. 6 and 7, the element region 1C may overlap the entire trench isolation arrangement prohibition region 1A in plan view. In this case, the element region 1C includes entire of the region directly under the Cu ball CB, and in plan view, the trench isolations DT2 surrounding the element region 1C surround the entire trench isolation arrangement prohibition region 1A. That is, the trench isolations DT2 are separated from the trench isolation arrangement prohibition region 1A. Further, in the element region 1C, the trench isolations DT1 are not formed.

In the present modified example, both the trench isolations DT1 which are dummy element isolations and the trench isolations DT2 which are used for electrically isolating the elements, are formed at positions separated from the trench isolation arrangement prohibition region 1A. This prevents shear stress from acting in the semiconductor substrate SB with reference to the trench isolations DT1 or DT2 when the Cu wire is pushed toward the semiconductor substrate SB side or pulled upward. Therefore, since silicon peeling, the oxide film peeling or the occurrence of cracking in the oxide film in the semiconductor chip can be prevented, it is possible to improve the reliability of the semiconductor device.

Second Modified Example

Figure 8:
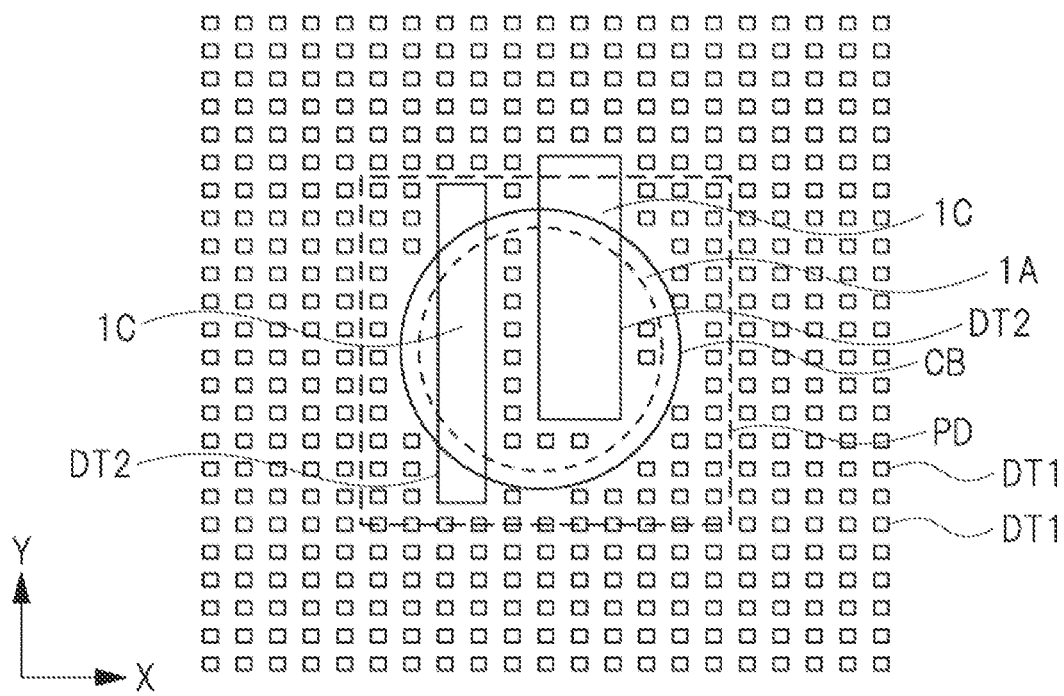
FIG. 8 is a planar layout showing a semiconductor device according to second modified example of the second embodiment.
Figure 9:
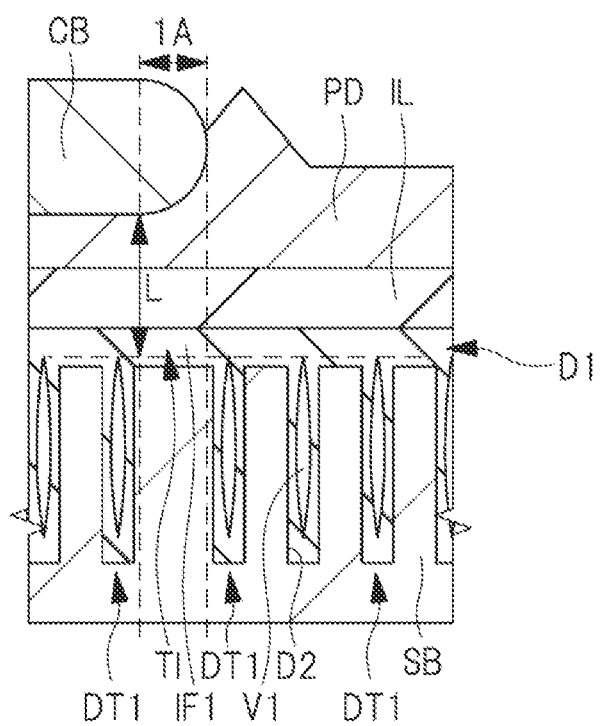
FIG. 9 is an enlarged cross-sectional view showing a semiconductor device according to the second modified example of the second embodiment.

As shown in FIGS. 8 and 9, the element region 1C may overlap a part of the trench isolation arrangement prohibition region 1A in plan view. Here, a part of each of the element region 1C and the trench isolations DT2 therearound overlaps the Cu ball CB in plan view. Here, the trench isolations DT2 including the void V1 therein are formed in the trench isolation arrangement prohibition region 1A. However, the circular trench isolation arrangement prohibition region 1A and the trench isolations DT2 intersect in plan view, and do not overlap in parallel.

When the trench isolation arrangement prohibition region 1A and the trench isolations DT2 are parallel in plan view, that is, when the trench isolations DT2 extend like the tangent of the circle-shaped trench isolation arrangement prohibition region 1A, shear stress is likely to occur as described in the room for improvement. However, as in the present modified example, when the trench isolation arrangement prohibition region 1A and the trench isolations DT2 intersect in plan view, it is possible to suppress the occurrence of shear stress. The angles at which the trench isolation arrangement prohibition region 1A extending in a circular shape and the trench isolations DT2 intersect each other in plan view are preferably, for example, 45 degrees or more and 90 degrees or less.

In the present modified example, similar to the abovementioned first embodiment, the trench isolations DT1 which are dummy element isolations, are separated from the trench isolation arrangement prohibition region 1A. Therefore, in the present modified example, when the Cu wire is pushed to the semiconductor substrate SB side or pulled upward, with reference to the trench isolations DT1 or DT2, it is possible to prevent the shear stress from acting in the semiconductor substrate SB. Therefore, since silicon peeling, the oxide film peeling or the occurrence of cracking in the oxide film in the semiconductor chip can be prevented, it is possible to improve the reliability of the semiconductor device.

Third Embodiment

Figure 10:
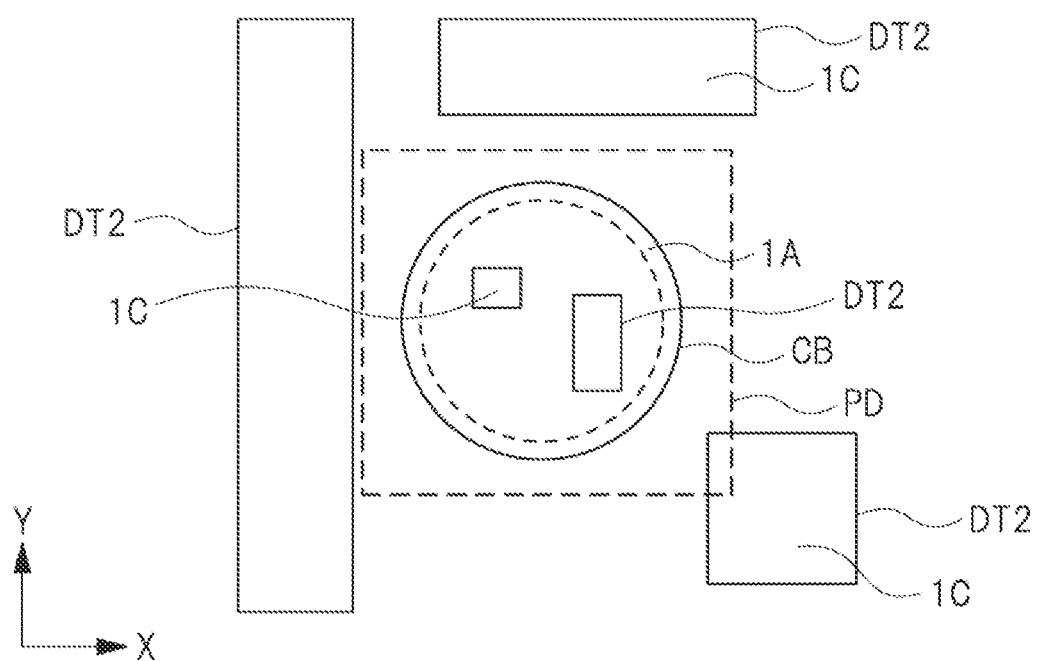
FIG. 10 is a planar layout showing a semiconductor device according to third embodiment.
Figure 11:
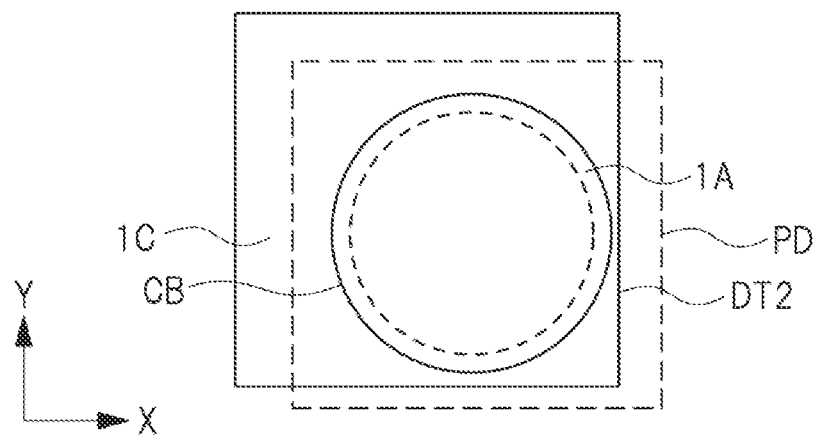
FIG. 11 is a planar layout showing a semiconductor device according to the third embodiment.
Figure 12:
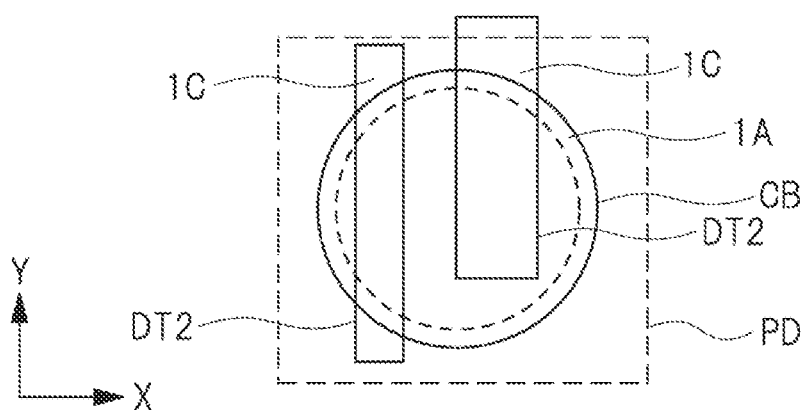
FIG. 12 is a planar layout showing a semiconductor device according to the third embodiment.

In the first embodiment and the second embodiment, the case where trench isolations which are dummy element isolations are formed has been described, but hereinafter, the case where there is no dummy element isolations will be described with reference to FIGS. 10 to 12. FIGS. 10, 11 and 12 are planar layouts showing separate embodiment, respectively.

Unlike the structure described with reference to FIG. 4, the structure shown in FIG. 10 does not have trench isolations DT1 which are dummy element isolations. Here, each of the element region 1C and trench isolations DT2 therearound are separated from the trench isolation arrangement prohibition region 1A and are located inside or outside the trench isolation arrangement prohibition region 1A in plan view. Since the trench isolations DT2 are not formed in the trench isolation arrangement prohibition region 1A and the trench isolations DT1 that are the dummy element isolations are not formed, the occurrence of shear stress can be more effectively prevented as compared with the second embodiment (see FIG. 4).

Unlike the structure described with reference to FIG. 6, the structure shown in FIG. 11 does not have trench isolations DT1 which are dummy element isolations. Here, the element region 1C overlaps the entire trench isolation arrangement prohibition region 1A in plan view, and the trench isolations DT2 around the element region 1C are separated from the trench isolation arrangement prohibition region 1A. Thus, the trench isolations DT2 are not formed in the trench isolation arrangement prohibition region 1A, and since the trench isolations DT1 which are dummy element isolations are not formed, as compared with the first modified example of the second embodiment (see FIG. 6), the occurrence of shear stress can be more effectively prevented.

Unlike the structure described with reference to FIG. 8, the structure shown in FIG. 12 does not have trench isolations DT1 which are dummy element isolations. Here, a part of each of the element region 1C and the trench isolations DT2 therearound overlap the trench isolation arrangement prohibition region 1A in plan view. However, the circular trench isolation arrangement prohibition region 1A and the trench isolations DT2 intersect in plan view, and do not overlap in parallel. Further, the trench isolations DT1 which are dummy element isolations are not formed. Therefore, compared to the second modified example of the second embodiment (see FIG. 8), the occurrence of shear stress can be more effectively prevented.

Although the invention made by the present inventor has been specifically described based on the embodiment, the present invention is not limited to the as described above embodiment, and it is needless to say that various modifications can be made without departing from the gist thereof.

What is claimed is:

1. A semiconductor device, comprising:
   a semiconductor substrate;
   a first trench formed on the semiconductor substrate;
   a second trench formed in a bottom surface of the first trench and having a deeper depth than the first trench;
   a first trench isolation formed of a first film embedded in the first trench;
   a second trench isolation formed of a second film, the second film being embedded in the second trench and having a first void therein in the second trench;
   a bonding wire connected to an upper surface of a pad on the first trench isolation, the second trench isolation and the semiconductor substrate;
   a ball configuring a tip of the bonding wire; and
   a circular first region overlapped with an end portion of the ball in plan view,
   wherein the first region is a region between an end portion of a bottom surface of the ball closest from the first void in a first direction perpendicular to an upper surface of the semiconductor substrate and an outermost periphery of the ball in a second direction along the upper surface of the semiconductor substrate, and includes directly under the ball, and
   wherein the second trench isolation is separated from the first region in plan view.

2. The semiconductor device according to claim 1, comprising:
   a third trench formed in the bottom surface of the first trench and having a deeper depth than the first trench;
   a third trench isolation formed of the second film, the second film being embedded in the third trench and having a second void therein in the third trench; and
   an element region in which a semiconductor element is formed,
   wherein the third trench isolation electrically isolate the semiconductor element,
   wherein the second trench isolation is a pseudo element isolation, and
   wherein the third trench isolation is separated from the first region in plan view.

3. The semiconductor device according to claim 2,
   wherein, in plan view, the element region overlaps with an entire of the ball, and the third trench isolation surrounds the first region.

4. The semiconductor device according to claim 1, comprising:
   a third trench formed in the bottom surface of the first trench and having a deeper depth than the first trench;
   a third trench isolation formed of the second film, the second film being embedded in the third trench and having a second void therein in the third trench; and
   an element region in which a semiconductor element is formed,
   wherein the third trench isolation electrically isolate the semiconductor element,
   wherein the second trench isolation is a pseudo element isolation, and
   wherein the third trench isolation intersects the first region in plan view.

5. The semiconductor device according to claim 1,
   wherein the second film is a dielectric film, a silicon film or a metal film.

6. The semiconductor device according to claim 1,
   wherein the second trench isolation is a pseudo element isolation.

7. The semiconductor device according to claim 1, comprising:
   an element region in which a semiconductor element is formed, and
   wherein the second trench isolation electrically isolate the semiconductor element.

8. The semiconductor device according to claim 7,
   wherein, in plan view, the element region overlaps with an entire of the ball, and the second trench isolation surrounds the first region.

9. A semiconductor device, comprising:
   a semiconductor substrate;
   a first trench formed on the semiconductor substrate;
   a second trench formed in a bottom surface of the first trench and having a deeper depth than the first trench;
   a first trench isolation formed of a first film embedded in the first trench;
   a second trench isolation formed of a second film, the second film being embedded in the second trench and having a first void therein in the second trench;
   a bonding wire connected to an upper surface of a pad on the first trench isolation, the second trench isolation and the semiconductor substrate;
   a ball configuring a tip of the bonding wire;
   a circular first region overlapped with an end portion of the ball in plan view; and
   an element region in which a semiconductor element is formed,
   wherein the second trench isolation electrically isolate the semiconductor element,
   wherein the first region is a region between an end portion of a bottom surface of the ball closest from the first void in a first direction perpendicular to an upper surface of the semiconductor substrate and an outermost periphery of the ball in a second direction along the upper surface of the semiconductor substrate, and includes directly under the ball, and
   wherein the second trench isolation intersects the first region in plan view.

10. The semiconductor device according to claim 9,
    wherein the second film is a dielectric film, a silicon film or a metal film.

* * * * *